United States Patent
Edwards

(10) Patent No.: US 12,546,666 B2
(45) Date of Patent: Feb. 10, 2026

(54) APPARATUS AND METHOD TO TEST EMBEDDED THERMOELECTRIC DEVICES

(71) Applicant: TEXAS INSTRUMENTS INCORPORATED, Dallas, TX (US)

(72) Inventor: Henry L. Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/798,544

(22) Filed: Mar. 13, 2013

(65) Prior Publication Data

US 2013/0188667 A1 Jul. 25, 2013

Related U.S. Application Data

(63) Continuation-in-part of application No. 12/790,688, filed on May 28, 2010, now Pat. No. 11,133,350, which is a continuation-in-part of application No. 12/201,679, filed on Aug. 29, 2008, now Pat. No. 12,154,841.

(60) Provisional application No. 61/182,052, filed on May 28, 2009, provisional application No. 61/182,055, filed on May 28, 2009, provisional application No. 60/968,805, filed on Aug. 29, 2007.

(51) Int. Cl.
| | |
|---|---|
| *G01K 7/02* | (2021.01) |
| *H01L 21/66* | (2006.01) |
| *H01L 23/34* | (2006.01) |
| *H01L 23/38* | (2006.01) |
| *H10N 19/00* | (2023.01) |

(52) U.S. Cl.
CPC ............. *G01K 7/02* (2013.01); *H01L 22/34* (2013.01); *H01L 23/345* (2013.01); *H01L 23/38* (2013.01); *H10N 19/00* (2023.02); H01L 2924/0002 (2013.01)

(58) Field of Classification Search
None
See application file for complete search history.

(56) References Cited

U.S. PATENT DOCUMENTS

| | | | |
|---|---|---|---|
| 5,261,747 | A | 11/1993 | Deacutis |
| 6,207,887 | B1 | 3/2001 | Bass |
| 6,327,149 | B1 | 12/2001 | Goenka |
| 6,476,508 | B1 | 11/2002 | Strnad |
| 6,711,904 | B1 | 3/2004 | Law |
| 6,774,450 | B2 | 8/2004 | Inbe |
| 6,806,470 | B2 | 10/2004 | Iida |
| 2005/0067005 | A1 | 3/2005 | Van Der Spek |

(Continued)

OTHER PUBLICATIONS

Boukai et al., "Silicon Nanowires as Efficient Thermoelectric Materials—Supplementary Information (Experiment)," Nature Publishing Group, doi: 10.1038/nature06458, pp. 1-21.

(Continued)

*Primary Examiner* — Dustin Q Dam
(74) *Attorney, Agent, or Firm* — Frank D. Cimino

(57) ABSTRACT

An integrated circuit containing an embedded resistor in close proximity to an embedded thermoelectric device. An integrated circuit containing an embedded resistor in close proximity to an embedded thermoelectric device composed of thermoelectric elements and at least one switch to disconnect at least one thermoelectric element from the thermoelectric device. Methods for testing embedded thermoelectric devices.

11 Claims, 4 Drawing Sheets

(56) References Cited

U.S. PATENT DOCUMENTS

| | | |
|---|---|---|
| 2005/0112798 A1 | 5/2005 | Bjorbell |
| 2006/0260793 A1 | 11/2006 | Yang |
| 2007/0034305 A1 | 2/2007 | Suh |
| 2007/0095381 A1 | 5/2007 | Lee |
| 2007/0125414 A1 | 6/2007 | Bettencourt |
| 2008/0115818 A1 | 5/2008 | Cheng |
| 2008/0173537 A1 | 7/2008 | Desteese |
| 2008/0317087 A1* | 12/2008 | Kimura .................. G01J 5/16 374/1 |
| 2009/0014807 A1 | 1/2009 | Tang |
| 2009/0056345 A1 | 3/2009 | Edwards et al. |
| 2009/0072385 A1 | 3/2009 | Alley |
| 2009/0179323 A1 | 7/2009 | Feng |
| 2010/0003199 A1 | 1/2010 | Kilpatrick et al. |
| 2010/0006132 A1 | 1/2010 | Hodes |
| 2011/0023929 A1 | 2/2011 | Edwards |
| 2011/0073149 A1 | 3/2011 | Ladner |
| 2012/0118060 A1* | 5/2012 | Kimura ................ G01L 9/0019 73/384 |

OTHER PUBLICATIONS

"Shallow trench isolation"; https://en.wikipedia.org/w/index.php?title=Shallow_trench_isolation&oldid=1040502151 (last visited Mar. 3, 2022).

Boukai et al., "Silicon Nanowires as Efficient Thermoelectric Materials—Supplementary Information (Experiment)," Nature Publishing Group, doi: 10.1038/nature06458, pp. 1-21 (2008).

Edwards et al. "Performance Metrics for Thermoelectric Energy Harvesting Studied Using a Novel Plana 6523 Silicon CMOS-Based Thermopile," IEEE Sensors 2013 Conference, Baltimore, MD, Nov. 3-6, 2013, pp. 1-4.

Hochbaum et al. "Enhanced Thermoelectric Performance of Rough Silicon Nanowires," Nature Publishing Group, vol. 451, Jan. 10, 2008, doi:10.1038/nature06381, pp. 163-168.

Wang et al., "Analytical Modeling of Silicon Thermoelectric Microcooler," Journal of Applied Physics 100, 2006, p. 014501-1 through 01450-13.

Wang et al,. "On-Chip Hot Spot Cooling Using Silicon Thermoelectric Microcoolers," Journal of Applied Physics (AIP), vol. 102, Issue 3, Device Physics, Aug. 2, 2007, pp. 1-3.

\* cited by examiner

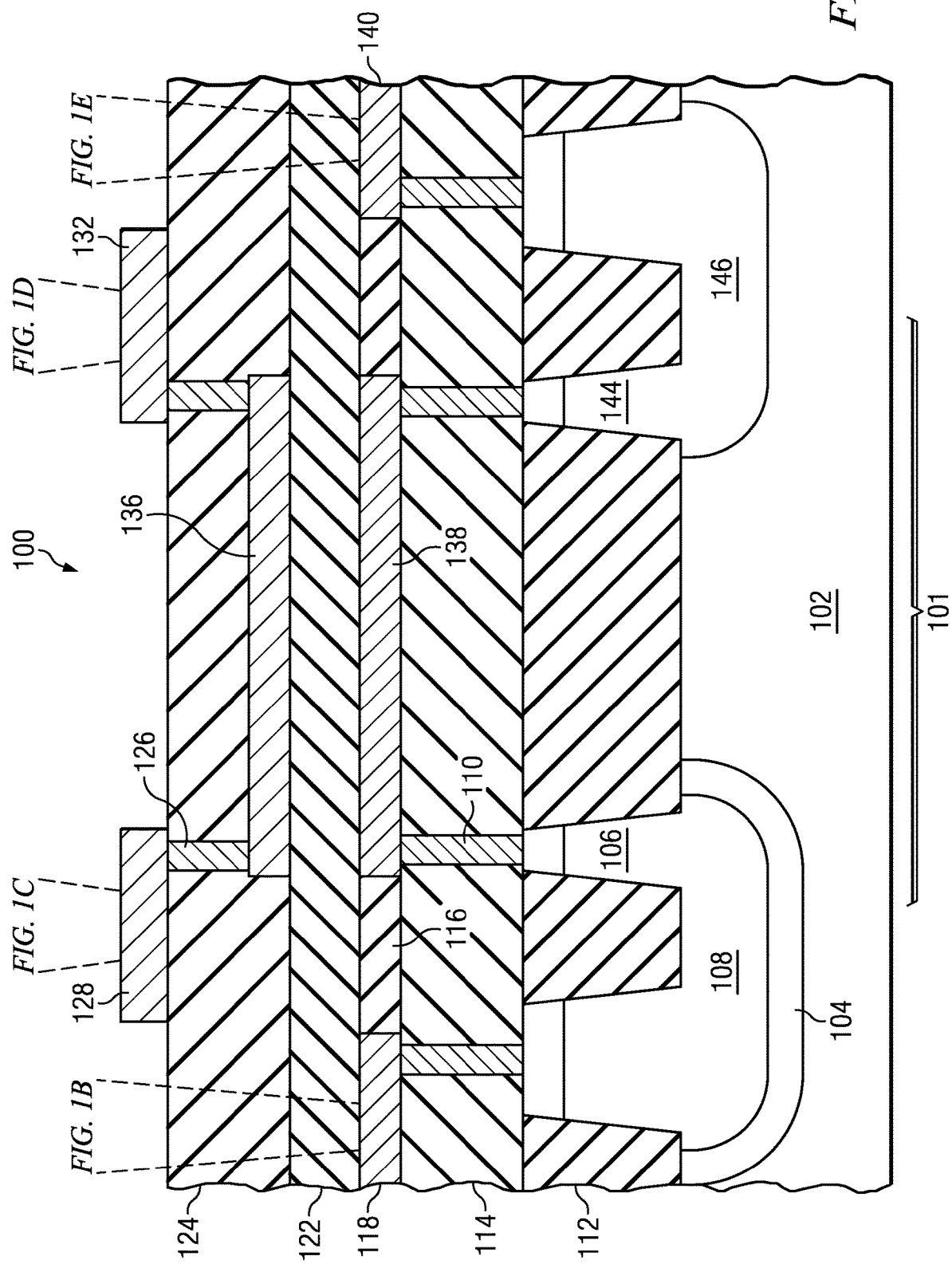

APPARATUS AND METHOD TO TEST EMBEDDED THERMOELECTRIC DEVICES

This application is a continuation-in-part of application Ser. No. 12/790,688 filed May 28, 2010, which application Ser. No. 12/790,688 is a continuation-in-part of application Ser. No. 12/201,679 filed Aug. 29, 2008 and also claims priority from and the benefit of Provisional Application Nos. 61/182,052 filed May 28, 2009 and 61/182,055 filed May 28, 2009; which application Ser. No. 12/201,679 claims priority from and the benefit of Application No. 60/968,805 filed Aug. 29, 2007; the entireties of all of which are incorporated herein by reference.

BACKGROUND

This relates to the field of integrated circuits. More particularly, this relates to apparatus and methods for the testing of integrated circuits containing embedded thermoelectric devices.

Integrated circuits with embedded thermoelectric device are known and described in U.S. patent application Ser. No. 12/201,679. After the manufacturing of an integrated circuit containing an embedded thermoelectric device is complete, the integrated circuit and the embedded thermoelectric device are tested. The chips with integrated circuits that fail to meet specifications and with thermoelectric devices that fail to meet specifications may be scrapped or sent for failure analysis.

Typically, the integrated circuit is tested using conventional final test equipment and the thermoelectric device is tested using special equipment which may apply a temperature gradient across the integrated circuit chip while an electrical output is monitored. The special testing equipment and additional test time required to evaluate the thermoelectric device adds additional cost and cycle time. In addition, it is difficult to achieve accurate thermal coupling between thermoelectric testing equipment and the device under test, so it can be difficult to achieve reproducible and accurate testing using an externally applied temperature gradient.

A thermoelectric device may be composed of many thousands of thermocouples that may be coupled together serially and in parallel. Typically, when a thermoelectric device fails to meet specifications it is scrapped or sent to failure analysis. It may be challenging and time consuming during failure analysis to locate the one or several bad thermocouples out of thousands or tens of thousands of good thermocouples. Furthermore, as the number of thermocouples increases, it becomes increasingly difficult to find defective thermocouples by testing the entire array as a unit.

SUMMARY

An embedded resistor heater/thermometer is formed in close proximity to the thermoelectric device. A method to test an embedded electrical device using conventional electrical final test equipment. A method using electrical switches contained in a thermoelectric device to identify which thermocouple or thermocouples caused an embedded thermoelectric device to fail specifications.

BRIEF DESCRIPTION OF THE DRAWINGS

FIGS. 1A-1E are cross-sectional and top views of an integrated circuit with an embedded thermoelectric device and an embedded resistor according to principles of the invention.

DETAILED DESCRIPTION OF EXAMPLE EMBODIMENTS

By fabricating an embedded resistor near an integrated thermoelectric device, conventional final test equipment may be used to evaluate the functionality and performance of the thermoelectric device. The embedded resistor may be used as a resistance heater to cause a thermal gradient to form across the thermoelectric device or it may be used to monitor a change in temperature of the chip caused by operation of the embedded thermoelectric device. This may be performed using conventional final test equipment and may eliminate the need for special equipment and significantly reduce the time needed to test an embedded thermoelectric device thus significantly reducing cost.

The term embedded resistance heater/thermometer refers to an embedded resistor that is constructed in close proximity to the thermoelectric device and that may be used as a resistance heater or may be calibrated to monitor chip temperature. The embedded resistor may have two or more terminals. A four terminal resistor allows accurate measurement of resistance because two terminals may be used to force current from a current source, while the other two terminals connect to a voltmeter to monitor voltage. This allows resistance to be measured accurately regardless of contact resistance at the terminals. The current source may be a current mirror, a bandgap-referenced current source, or other on-chip current reference. The voltmeter may be an analog-to-digital converter. The embedded resistor may also ye configured to connect to an external current source in an off-chip tester or in another element of the system in which the integrated circuit is incorporated.

In some circumstances it may be possible to use a two-terminal embedded resistor instead of a four-terminal embedded resistor. For example, the contact resistance in the interconnects may be highly repeatable, thus allowing for precise calibration of the resistance measurement. In certain integrated circuits where it is to be used as a heater onluy, and embedded two terminal resistance heater my be used because the voltage need not be sensed.

Figure 1B:
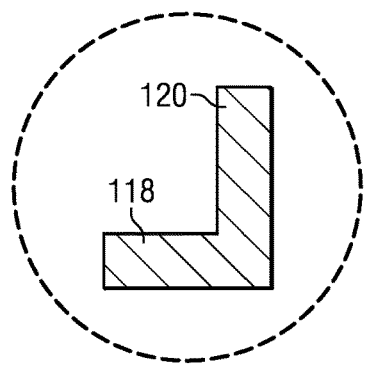

An example embodiment embedded resistance heater/thermometer 134 that is formed in close proximity to a thermoelectric device is illustrated in FIG. 1. FIG. 1A through 1E are a cross section 100 describing the thermoelectric device 101 and a resistance heater/thermometer 136. FIG. 2 is a circuit diagram 150 corresponding to the cross section 100. Like elements are labeled with the same number in cross section 100 and circuit diagram 150. The integrated circuit is constructed in a p-type substrate 102 and includes shallow trench isolation (STI) 112, an isolated pwell 108 contained in a deep nwell 104, an nwell 146, a p-type thermopile 106 and an n-type thermopile 144 connected together by a metal-1 strap 138. The two thermopiles, 106 and 144, form a thermocouple 101. The thermocouple may be used in a thermogeneration mode to generate electricity or in a thermo refrigeration mode to provide cooling. The integrated circuit also includes premetal dielectric (PMD)

114, contacts 110, intermetal dielectric (IMD1) 116, metal-1 118, IMD2 122, metal-2 136, IMD-3 124, via-2 126, and metal-3 128. Although the thermoelectric device 101 consists of one thermocouple in FIG. 1, an embedded thermoelectric device may contain many thousands of thermocouples connected in series and in parallel.

Figure 1C:
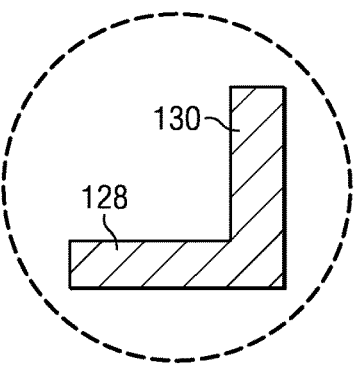
Figure 1D:
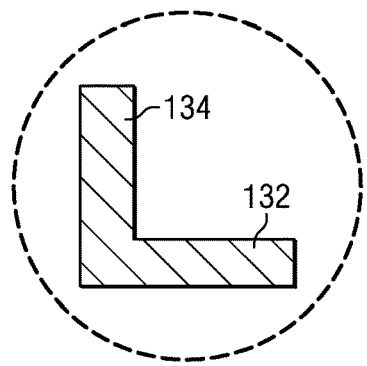
Figure 2:
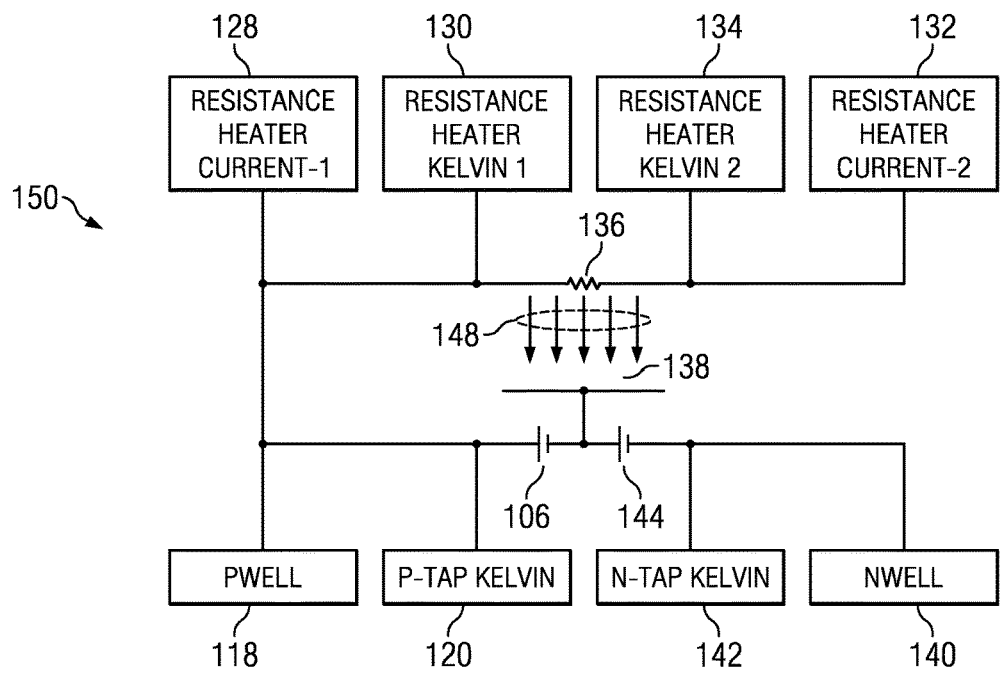
FIG. 2 is a circuit diagram of the embedded thermoelectric device with an embedded resistor according to principles of the invention

The layout of Metal-3 leads illustrated in a top down view in FIG. 1C and FIG. 1D, forms a 4-terminal Kelvin resistor with metal-2 resistor 136. Current may be supplied to resistor 136 through leads 128 in FIG. 1C and 132 in FIG. 1D. The voltage developed across the resistor 136 may be measure using leads 130 in FIG. 1C and 134 in FIG. 1D. The resistance may then be calculated with the equation, $R_R = V_R/I_R$. The change in resistance may be calibrated and used to monitor the temperature of the chip. The resistor 136 may also function as a resistance heater by forcing current through the resistor 136 to supply a heat source for embedded thermoelectric generators.

The current generated by embedded thermoelectric device 101 may be measured at the output leads 118 and 140. Similar to the resistor 136, a four terminal measurement may be performed across the thermoelectric device 101 using the leads shown in the top down views in FIG. 1B and FIG. 1E. For example, when the thermocouple is being used in a thermocooling mode, current may be supplied through leads 118 in FIG. 1B and 140 in FIG. 1E. The voltage that is produced across the thermocouple 101 may be measured using leads 120 in FIG. 1B and 142 in FIG. 1E. The resistance of the thermocouple may be calculated with the equation $R_{TE} = V_{TE}/I_{TE}$.

A number of functional tests may be performed on the thermoelectric device 101 with conventional final probe equipment using the embedded resistor, 136, either as a resistance heater or as a chip temperature monitor.

In one embodiment test may be to measure the open circuit voltage, $V_{OC}$, produced by thermogenerator, 101, as a function of the amount of current forced through resistor 136. $V_{OC}$ may be measured across leads 120 and 142 with leads 118 and 140 disconnected from Vcc and Vss. A series of currents, $I_R$, may be forced through the resistance heater, 136, to generate a series of thermal gradients across the thermogenerator, 101. A curve of $V_{OC}$ vs $I_R$, may be constructed and compared to specifications. This test may be performed with conventional final probe equipment.

In another embodiment test the short circuit current, $I_{SC}$, produced by thermogenerator, 101, may be measured. In this test a series of currents, $I_R$, may be forced through resistance heater, 136, to create a series of different temperature gradients across the thermogenerator, 101. At each of the temperature gradients, a current, $I_{SC}$, may be forced through leads 118 and 140 in FIG. 2, until the voltage, $V_{TC}$, across leads 120 and 142 is equal to zero. The current at this condition is the short circuit current, $I_{SC}$, current. A curve of $I_{SC}$ vs $I_R$, may be constructed and compared to specifications. This test may be performed with conventional final probe equipment.

Resistor 136 may be calibrated to monitor chip temperature by forcing a series of currents, $I_R$, through the resistor, 136, and measuring the voltage, $V_R$, across the resistor, 136. The voltage may be fit to a cubic equation, $V_R = C_0 + C_1 I_R + C_2 I_R^2 + C_3 I_R^3$, where $C_0$, $C_1$, and $C_3$ are curve fitting constants. Points from this graph may be plugged into equation, $V_R/I_R = R_{R,T0}(1+TC_R I_R^2 R_{R,T0})/\Theta_R$, where $C_R$ is the temperature coefficient of resistance for the resistor 136 material to determine the value of, $\Theta_R$, which is the thermal impedance of resistor 136. The temperature may then be calculated using the equation, $T = T_0 + (I_R^2 R_{R,T0})/\Theta_R$. The value for $C_R$ may be taken from a table if the resistor, 136, is made from a pure metal or may be determined by measuring resistance vs temperature by placing an integrated circuit chip with the embedded resistor, 136, in a bake oven and taking resistance measurements at several temperatures. The embedded resistor, 136, may be calibrated in this manner and the data from this calibration may be used for all subsequent chips with the same integrated circuit manufactured with the same process.

Figure 1E:
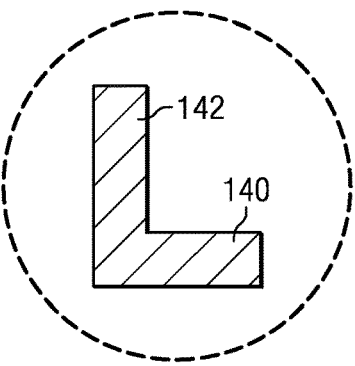

The resistance across thermoelectric device 101 may be calibrated in a manner similar to that described for the embedded resistor, 136, by forcing a series of currents, $I_{TC}$, across leads 118 in FIG. 1B and 140 in FIG. 1E and measuring the voltage drop, $V_{TC}$, between leads 120 in FIG. 1B and 142 in FIG. 1E.

In addition to calibration of the resistor, 136, or the thermodevice, 101, in FIG. 1 as chip temperature monitors, other integrated circuit components such as a silicon diode, or a transistor subthreshold slope may be measured at various temperatures and used to evaluate the performance of a thermoelectric device. For example, the forward voltage of a silicon diode is temperature dependent. By comparing the bandgap voltages, $\Delta V_{BG}$, of a silicon diode at two different currents, $I_1$ and $I_2$, the temperature may be determined using the equation, $\Delta V_{BG} = (kT/q)\ln(I_1/I_2)$. An electric circuit, such as the Brokaw bandgap reference may be used to measure $\Delta V_{BG}$ and therefore monitor the temperature for various embedded thermoelectric device operating conditions.

Figure 5:
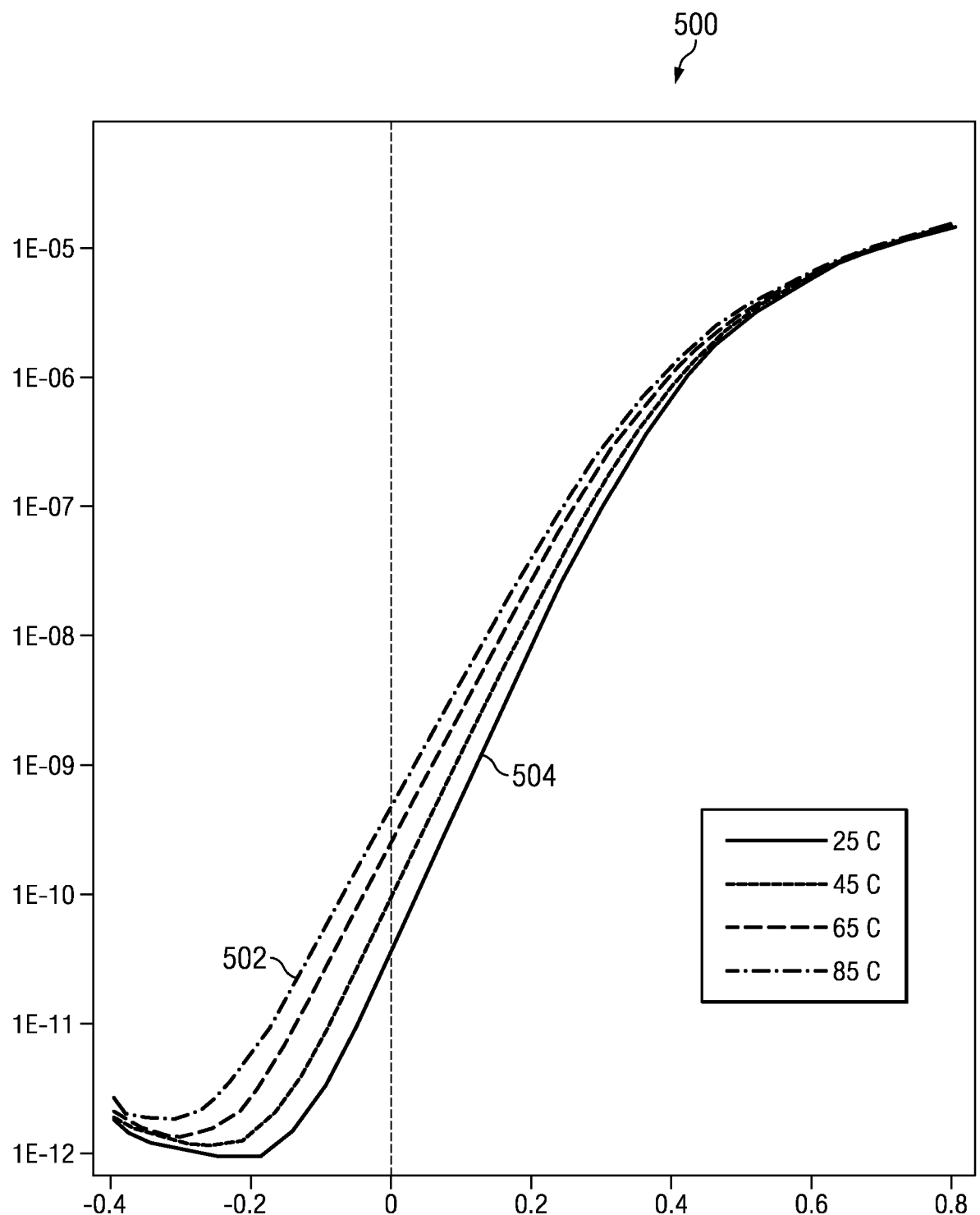
FIG. 5 is a graph illustrating the temperature dependence of the subthreshold slope of a nmos transistor.

FIG. 5 shows the change in an nmos transistor subthreshold slope (SS) versus temperature. The subthreshold slope gets less steep as the temperature of the transistor changes from 25 C for SS trace 504 to 85 C for SS trace 502. These means of monitoring temperature of an integrated circuit chip may also be utilized with conventional final probe equipment to test functionality of embedded thermoelectric devices.

Another embodiment method to evaluate performance of a thermoelectric device, 101, may be to run the thermoelectric device in a refrigeration mode and to monitor the temperature of the integrated circuit chip. In this mode a series of currents, $I_{cooling}$, may be forced between pads 140 and 118 in FIG. 2. At each, $I_{cooling}$, the temperature of the integrated circuit chip may be monitored by measuring the resistance, $R_R$, of resistor, 136, the resistance, $R_{TC}$, of thermoelectric device, 101, the change in transistor subthreshold slope or the bandgap of a silicon diode. The change in resistance, subthreshold slope, bandgap voltage or temperature may be compared to specifications to determine if the thermoelectric cooler is functioning properly. These tests may also be performed using conventional final probe equipment.

The above example embodiment functional tests may be performed to test an embedded thermoelectric device using conventional final testing equipment. Other functional tests, such as generating a thermoelectric device load line may also be performed and is within the scope of this invention.

A pulsed method of testing may also be advantageous to determine the heat capacity of the integrated circuit and to determine the rate at which the integrated circuit heats up and cools down. The heat capacity of an object is equal to the specific heat capacity, $C_v$, times the volume, V. The equation, $-K\Delta T = C_v V d(\Delta T)/dt$, where K is the thermal conductance of the integrated circuit, $\Delta T$ is difference in temperature of the integrated circuit and the surroundings, and $d(\Delta T)/dt$ is the change in the temperature delta with respect to time, may be integrated to give $\ln(\Delta T) = -tK/C_v V + c$, where c is a constant. A log plot of $\Delta T$ vs t has a slope of K/C$_v$V which is a characteristic of the thermal conductance and heat capacity of the integrated circuit.

Providing pulses of current to the embedded resistor heater may also be used to measure the generated current, I$_{sc}$, and/or the generated voltage, V$_{oc}$, as a function of time. The time delay between the resistor temperature and the generated current or voltage may be interpreted in terms of heat capacity and thermal conductance between the resistance heater and the thermoelectric device.

Figure 3:
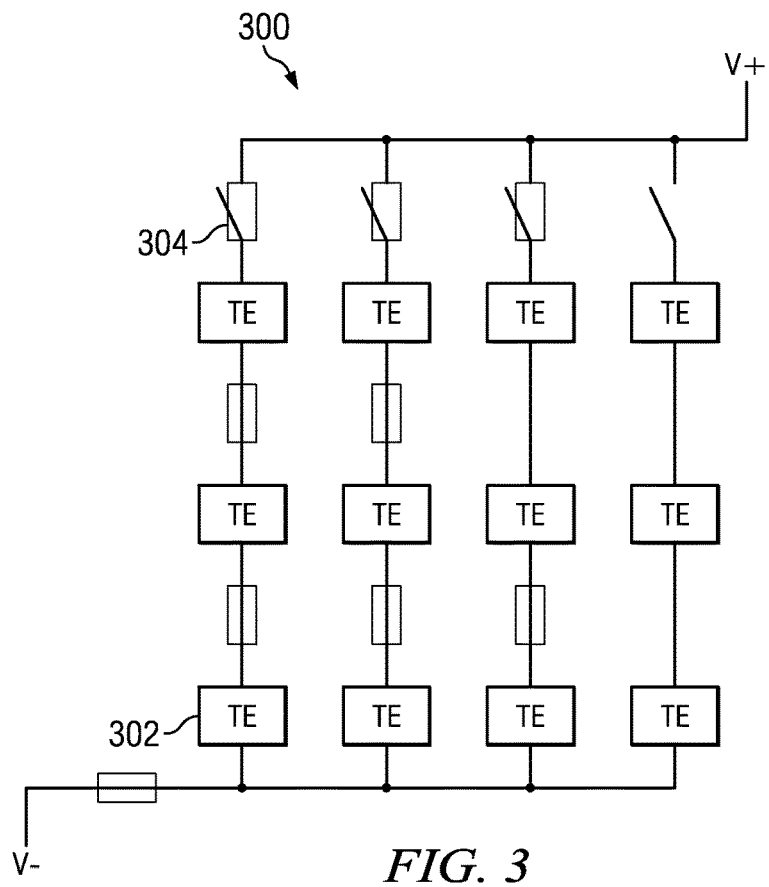
FIG. 3 is a thermoelectric device containing switches that may be tested according to principles of the invention.
Figure 4:
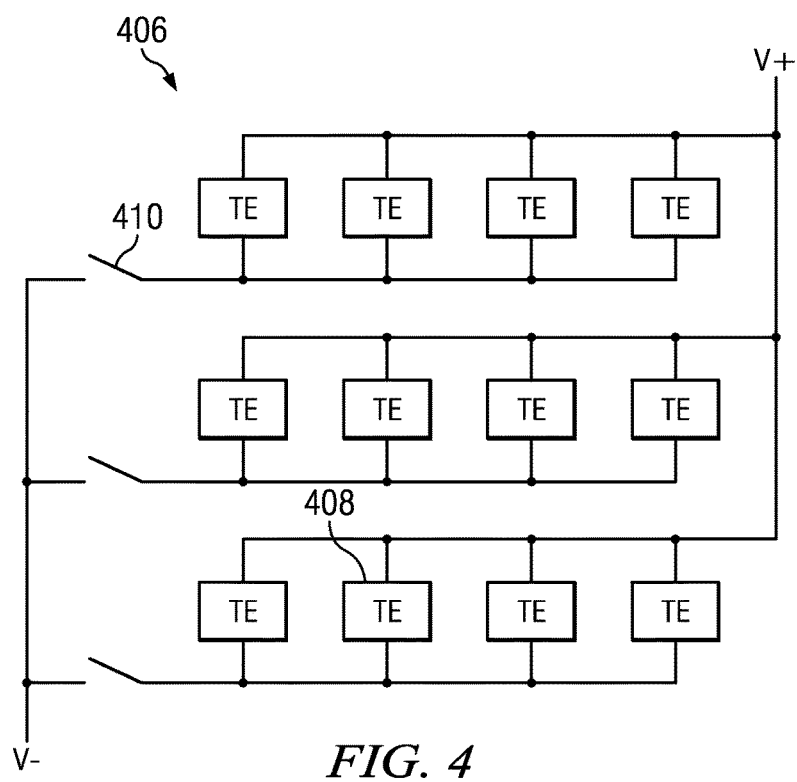
FIG. 4 is a thermoelectric device containing switches that may be tested according to principles of the invention.

If an embedded thermoelectric device fails specifications it may be very difficult to locate a few defective thermocouples among thousands of thermocouples. As the number of thermocouples increases, it becomes increasingly difficult to find defective thermocouples by testing the entire array as a unit, so a test method enabling testing ot thermocouples individually or in groups smaller than the entire array is desirable. Such a test method is essential for high yield and high quality in volume production of integrated circuits incorporating one or more embedded thermoelectric devices. Determining the location of defective thermocouples in a large array of thermocouples may be greatly enhanced by incorporating switches in the thermoelectric device as shown in FIGS. 3 and 4. Testing smaller portions of a thermoelectric array increases the sensitivity and may allow the detection of defects that are not detectable by array-wide testing. For example, one bad thermocouple has much more impact on an array of 10 ten thermocouples than on an array of ten thousand thermocouples. This increased ability to detect and locate defective thermocouples may be important for product reliability.

The example thermoelectric device, 300, in FIG. 3 consists of 4 columns of thermoelectric elements 302 (thermoelectric generators or thermoelectric coolers) connected in series. Each of the thermoelectric elements, 302, may be an individual thermocouple or an array of thermocouples. In this example embodiment each column may be connected or disconnected from the thermoelectric device, 300, using a switch, 304. If there is a short in one of the columns causing the thermoelectric device, 300, to fail, the failing column may be identified when it is disconnected and the thermoelectric device then functions properly. Switches, 304, may be transistors or pass gates. Each of the functionality tests described in above embodiments may be performed on the thermoelectric device, 300, with one or more of the columns disabled. Other tests such as diode leakage and tests for shorts and opens may also be conducted and columns causing excessive leakage or opens identified.

Similarly thermoelectric device, 406, in FIG. 4 consists of 3 rows of thermoelectric elements 408 (thermoelectric coolers or thermoelectric generators) connected in parallel. Each of the thermoelectric coolers, 408, may be an individual thermocouple or an array of thermocouples. In this example embodiment each row may be connected or disconnected from the thermoelectric device, 406, using a switch, 410. Switches, 410, may be transistors or pass gates that are formed when the thermoelectric devices are formed with no additional patterning or processing steps. If there is a short or open in one of the rows causing the thermoelectric device, 406, to fail specification, the failing row may be identified when it is disconnected and the thermoelectric device functions properly.

Those skilled in the art to which this invention relates will appreciate that many other embodiments and variations are possible within the scope of the claimed invention.

What is claimed is:

1. An integrated circuit, comprising:
a semiconductor substrate including a thermoelectric device, the thermoelectric device including first and second thermopiles; and
a multi-layer interconnect structure on the semiconductor substrate, the multi-layer interconnect structure including:
a first contact and a second contact, the first contact electrically coupled to the first thermopile, and the second contact electrically coupled to the second thermopile;
a premetal dielectric layer laterally surrounding the first and second contacts;
a first metal layer including a metal connector electrically coupled between the first and second thermopiles;
a first intermetal dielectric layer laterally surrounding the first metal layer;
a second intermetal dielectric layer on the first intermetal dielectric layer, the second intermetal dielectric layer having first and second sides opposing one another, the first side facing towards the metal connector and the first and second thermopiles;
a second metal layer on the second side, the second metal layer including a resistor and vias electrically coupled to the resistor;
a third intermetal dielectric layer laterally surrounding the second metal layer; and
a third metal layer on the third intermetal dielectric layer, the third metal layer including leads electrically coupled to the vias,
in which the integrated circuit is configurable to: conduct a current via the leads and the resistor to generate a thermal gradient across the thermoelectric device, and provide a voltage across the leads representing a temperature of the integrated circuit.

2. The integrated circuit of claim 1, wherein the resistor has four terminals electrically coupled to the leads.

3. The integrated circuit of claim 2, wherein the resistor is formed with the thermoelectric device as a resistance element.

4. The integrated circuit of claim 1, wherein the thermoelectric device includes:
an array of thermoelectric elements arranged in multiple groups, each group having at least one thermoelectric element; and
multiple switches electrically coupled to the multiple groups, respectively.

5. An integrated circuit, comprising:
a semiconductor substrate including:
a thermoelectric device including thermoelectric elements, each thermoelectric element including thermopiles; and
a transistor capable of disconnecting at least one of the thermoelectric elements from the thermoelectric device; and
a multi-layer interconnect structure on the semiconductor substrate, the multi-layer interconnect structure including:
contacts electrically coupled to the thermopiles;
a premetal dielectric layer laterally surrounding the contacts;
a first metal layer including metal connectors, each metal connector electrically coupled between the thermopiles of each thermoelectric element;

a first intermetal dielectric layer laterally surrounding the first metal layer;

a second intermetal dielectric layer on the first intermetal dielectric layer, the second intermetal dielectric layer having first and second sides opposing one another, the first side facing towards the metal connectors and the thermopiles;

a second metal layer on the second side, the second metal layer including a resistor and vias electrically coupled to the resistor;

a third intermetal dielectric layer laterally surrounding the second metal layer; and a third metal layer on the third intermetal dielectric layer, the third metal layer including leads electrically coupled to the vias, in which the integrated circuit is configurable to: conduct a current received via the leads and the resistor to generate a thermal gradient across the thermoelectric device; and provide a voltage across the leads representing to a temperature of the integrated circuit.

6. The integrated circuit of claim 5, wherein the resistor has four terminals electrically coupled to the leads.

7. The integrated circuit of claim 6, wherein the resistor is formed with the thermoelectric device as a resistance element.

8. The integrated circuit of claim 1, wherein a first portion of the metal connector includes a metal piece having a surface abutting the first side of the second intermetal dielectric layer and a second portion of the metal connector includes first and second contacts respectively electrically coupling the first and second thermopiles to the metal piece.

9. The integrated circuit of claim 1, wherein the resistor overlaps the first and second thermopiles.

10. The integrated circuit of claim 1, wherein the resistor overlaps the metal connector.

11. The integrated circuit of claim 2, wherein the resistor is configured to receive current signals at two of the four terminals and provide voltage signals at the other two of the four terminals.

* * * * *